United States Patent [19]

Cali'

[11] Patent Number: 4,817,012

[45] Date of Patent: Mar. 28, 1989

[54] METHOD FOR IDENTIFICATION OF PARASITIC TRANSISTOR DEVICES IN AN INTEGRATED STRUCTURE

[75] Inventor: Roberta Cali', Milan, Italy

[73] Assignee: SGS Microelettronica S.p.A., Agrate, Italy

[21] Appl. No.: 856,583

[22] Filed: Apr. 25, 1986

[30] Foreign Application Priority Data

May 9, 1985 [IT] Italy .............................. 20631 A/85

[51] Int. Cl.⁴ ............................................ G06F 15/70
[52] U.S. Cl. .................................... 364/488; 364/489; 324/158 T
[58] Field of Search ............... 364/488, 489, 490, 491, 364/578; 324/158 T, 73 R, 73 PC

[56] References Cited

U.S. PATENT DOCUMENTS 4,520,448  5/1985  Tremintin ........................... 364/488
4,635,208  1/1985  Coleby et al. ....................... 364/491

OTHER PUBLICATIONS

Paul Groner; "Computer Aided Design of VLSI Saves Man-Hours, Reduces Errors", 4/81, pp. 55-57.
Kuo et al., "Computer Oriented Circuit Design", 1969, Chapter 1.

Primary Examiner—Parshotam S. Lall
Assistant Examiner—Ellis B. Ramirez
Attorney, Agent, or Firm—Victor Flores

[57] ABSTRACT

In order to identify parasitic transistors in bipolar integrated circuit structures, files relating to the parameters of the simulated circuit are established. These files are then manipulated to establish the operating parameters of the simulated circuit. These operating parameters are then examined to identify the conditions that lead to circuit degradation due to parasitic transistors. The structure in the integrated circuit that result in the parasitic transistors are then highlighted on the circuit display in order to facilitate appropriate design changes.

6 Claims, 3 Drawing Sheets

METHOD FOR IDENTIFICATION OF PARASITIC TRANSISTOR DEVICES IN AN INTEGRATED STRUCTURE

RELATED APPLICATION

The method described herein is related to Italian Patent Application No. 20631 A/85, filed 9/5/85 and is assigned to the same assignee as the instant application.

BACKGROUND OF THE INVENTION

Field of the Invention

This invention relates generally to the design of semiconductor devices and, more particularly, to the identification of parastic transistor structures in the design of a bipolar semiconductor integrated circuit.

Description of the Related Art

For certain voltage conditions, a bipolar integrated circuit chip can include unintended and undesirable transistors that can cause the loss of current during the operation of the circuit. These undesirable transistors are termed parasitic transistors and are created when a high voltage P-diffusion region in an integrated semiconductor device is produced next to a low voltage P-diffusion region or next to a low voltage metal region without the proper isolation between the high voltage and low voltage regions. It is known in the related art of commercially available computer software programs for use as computer-aided tools in the design and analyze solid state integrated circuits. An example of such a software program is the SPICE commercially available circuit analysis program in which nodes of an integrated circuit are user established, parameters defined for the components of the circuit between the nodes, and performance of the circuit computed for a multiplicity of operating conditions. Circuit analysis programs such as SPICE do not have the capability to graphically display where in the artwork of the integrated circuit a particular node is located for a circuit element. However, the circuit analysis programs can compile a wealth of information about a particular node of a particular circuit element, in particularly, what voltage value results at a particular node for a particular set of input operating parameters. However, this information alone does not help in determining where a parasitic transistor is located.

Similarly, it is known that there is software and computer design tools that can create the corresponding artwork for a particular electrical schematic of an integrated circuit and which will check for land pattern spacing and continuity. However, these software programs and associated design tools, in and of themselves, do not have the capability to perform a circuit analysis on the created artwork to identify what operating condition exists at a particular node for a given set of operating conditions. Again, insufficient information is available to locate a potential parasitic transistor in a semiconductor structure to take corrective action.

Consequently, a need is seen for a method and apparatus which can map an integrated circuit's nodal analysis information, such as the identity of nodes with a designated high voltage value, over to a computer driven software program and associated design tools that can graphically and visually display the location of the nodes and the surrounding artwork containing the particular nodal information, and thus allow for locating parasitic transistors.

SUMMARY OF THE INVENTION

It is therefore an object of the present invention to provide a method for identifying parasitic transistor devices in complex integrated semiconductor circuits.

It is another object of the present invention to provide a method for coordinating output files from commercially available software programs to aid in identifying parasitic transistor structures in an integrated circuit.

It is a more particular object of the present invention to merge selected output results in the output files of software programs for use in identifying structural relationships in complex integrated circuit designs that result in parasitic transistors.

The aforementioned and other objects are accomplished, according to the present invention, by a method that merges selected results contained in output files of software programs used in the design of integrated circuits to identify the conditions resulting in parasitic transistors. Utilizing commercially available computer software programs, circuit nodes and circuit parameters of an integrated circuit are entered in appropriate files. The files are then manipulated by a circuit analysis program according to physical operating conditions that result in generating instantaneous operating output files, including all nodal points of the simulated circuit. Similarly, utilizing physical layout software programs, the same circuit nodes used in the circuit analysis program are entered into files physically locating the nodes on the integrated circuit layout. The method of the instant invention then requires the identification of high voltage nodes according to circuit analysis output files. When these high voltages nodes are located in the physical layout and are determined to be coincident with a circuit implementation structures, a computer graphical display terminal linked to the physical layout data base provides a visual display of the regions for determining whether a potential parasitic transistor has been found.

These and other features of the present invention will be understood upon reading of the following description along with the drawing.

BRIEF DESCRIPTION OF THE DRAWINGS

FIG. 1A–1C shows the circuit analysis portion of the present invention.

DESCRIPTION OF THE PREFERRED EMBODIMENT

Detailed Description of the Drawing

Figure 1:
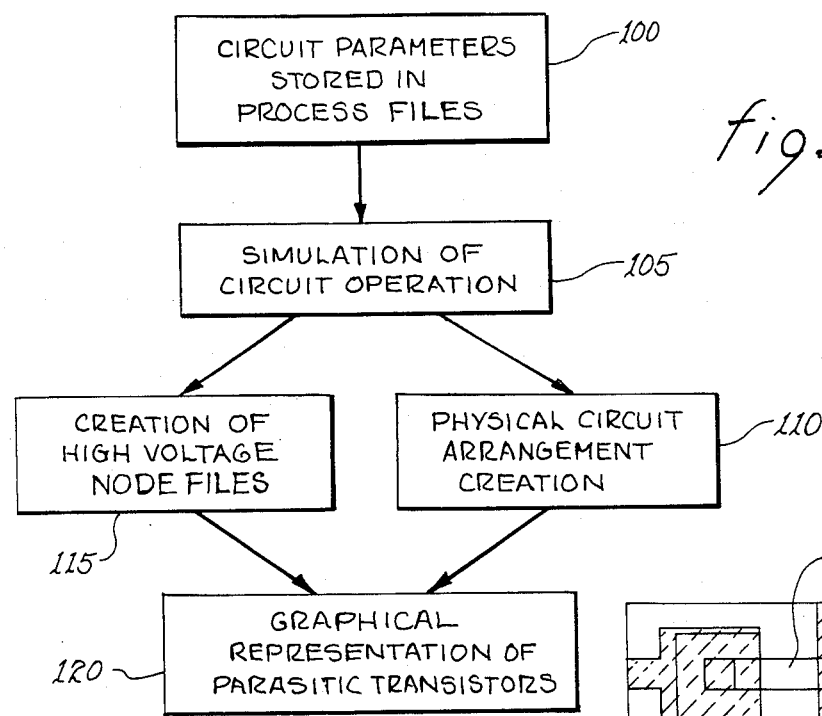
FIG. 1 general flow diagram of the process for identifying parasitic transistors according to the present invention.
Figure 1A:
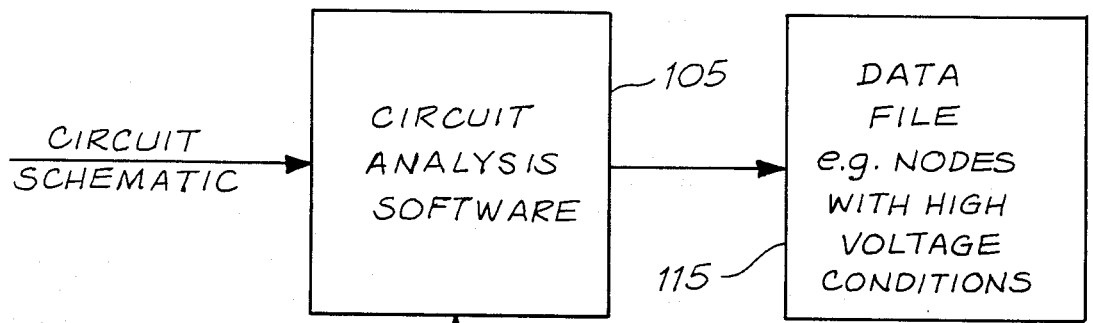
FIGS. 1a, 1b, and 1c show in a less general manner the flow diagram of the process used in identifying parasitic transistor regions according to the present invention.
Figure 1B:
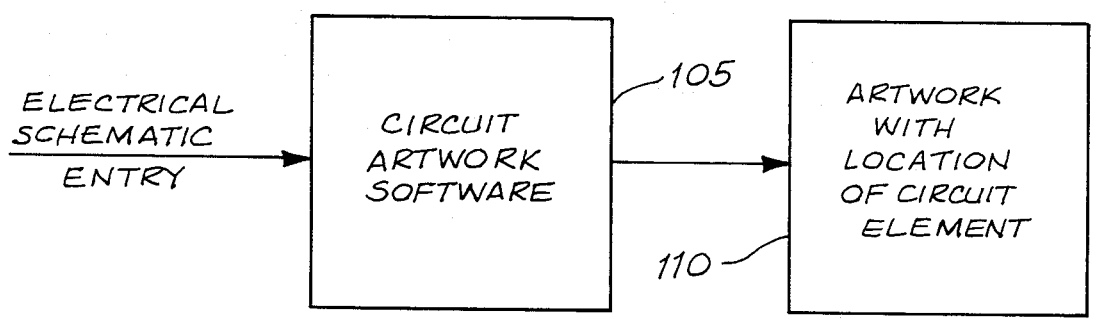
Figure 1C:
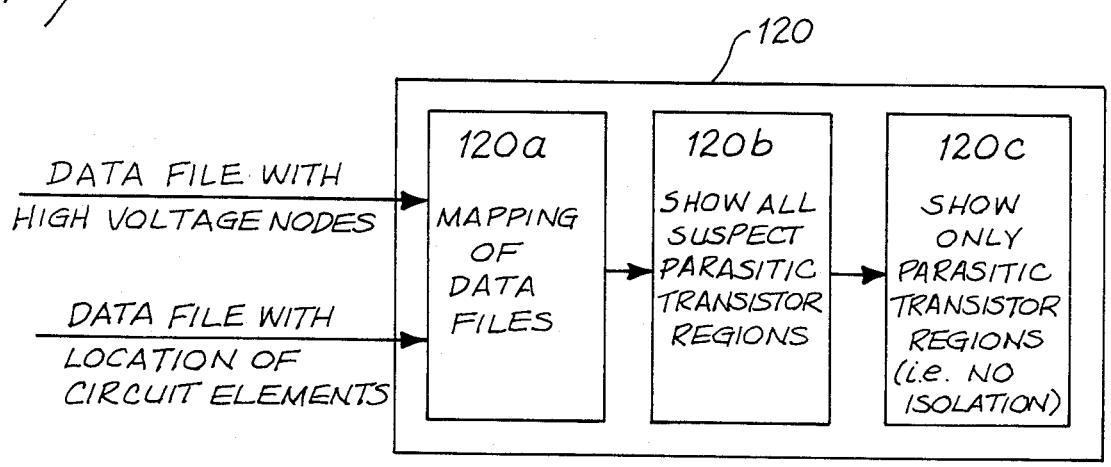

Referring to FIG. 1, a flow diagram of the operation of the process of the preferred embodiment is shown. In Step 100, the circuit parameters are placed in files available to computer circuit design and analysis software programs for use in the implementation of the design of the circuit. After the circuit nodes, design parameters and operating conditions are stored in the files, a circuit designer can analysis or physically layout a circuit. In Step 105, a circuit analysis can be performed by one of the commercially available programs such as the SPICE program, or can be performed by a proprietary program that provides similar manipulation of the files. From the circuit analysis, the high voltage nodes files can be created as in Step 115, while simultaneously, the physical layout of the circuit can be performed as in Step 110. The results of these two steps are combined in Step 120 where the graphical representation of potential parasitic transistors are shown. Referring to FIGS. 1a, 1b and 1c, a less general flow diagram of the process is shown. FIG. 1a shows the flow diagram for the circuit analysis portion whereby a computer-aided circuit analysis software program is used to configure a circuit according to input data containing circuit nodes, component values and operating conditions such as voltage and frequency. Details of such circuit analysis software programs are not discussed herein as they are considered to be well known and widely used by circuit designers. A variety of output files can be created from this using the circuit analysis program. In particular, an output file may be generated that contains the circuit nodes which meet the criteria of having a voltage potential greater than Vcc/2, i.e. a predetermined high voltage node. FIG. 1b shows a flow diagram of a related computer-aided circuit artwork, or physical layout software program, using the same electrical circuit, that can be used to create an integrated circuit physical layout, i.e. physically locate nodes and circuit elements and interconnecting metal paths. Details of circuit layout software programs are considered well known to circuit designers and are not included herein. The nodes identified by the physical layout and those used in the circuit analysis correspond to the same point. Thus, the physical layout software program can generate files relating to the physical location of a particular node in a circuit and can also graphically display the node and the surrounding structure for detail review by a circuit designer. Thus, as shown in FIG. 1c, when output file containing output data from the software programs circuit analysis and physical layout software programs are merged as in 120a, to show all suspect parasitic transistor regions, as in 120b, and finally to show only the parasitic transistor regions, a circuit designer can make the necessary modifications to his circuit design to prevent the undesirable parasitic transistor structures. In the graphical representation, the following areas alone will be shown or else will be identified. The epitaxial pockets with high voltage P-diffusion regions, regions of high voltage P-diffusion in these epitaxial pockets, low voltage P-diffusion regions in these epitaxial pockets, low voltage metal areas located over these epitaxial pockets and protection regions in these epitaxial pockets will be shown.

Figure 2:
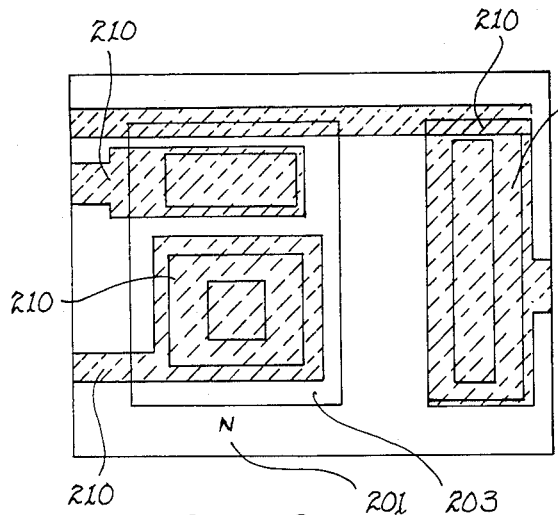
FIG. 2.

Referring to FIG. 2, region 201 is the epitaxial pocket while region 203 is a low voltage P-diffused region. The regions 210 indicate N-diffusion regions and low voltage diffused conductive regions that do not result in problem structures according to the present analysis. In this situation, a low voltage P-diffusion region in an epitaxial pocket does not result in positive identification of a parasitic transistor configuration.

Figure 3A:
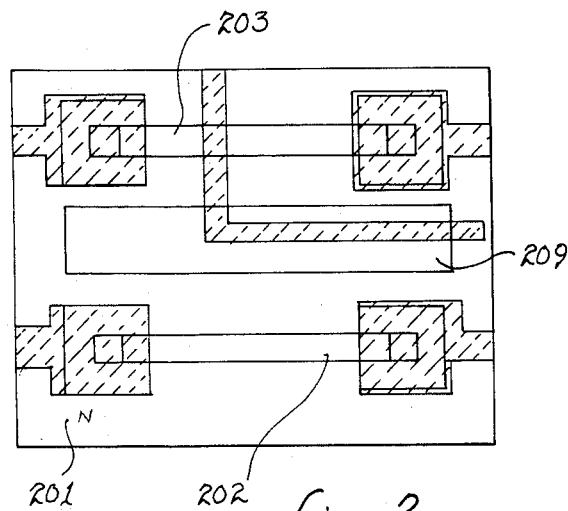
FIG. 3a and FIG. 3b.
Figure 3B:
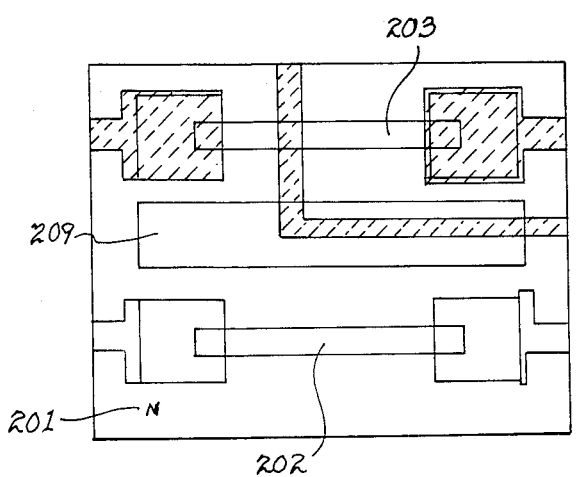

Referring to FIG. 3a, region 201 is the epitaxial pocket, 203 is a region of P-diffusion that is operated at a low voltage by the circuit, while region 202 is a region of P-diffusion operated at a high voltage by the circuit. In addition, region 209 is a protection region. Therefore, in FIG. 3b, the region 202 and accompanying elements are not highlighted because the protection region lies between the low voltage (203) and the high voltage (202) P-diffusion regions.

Figure 4A:
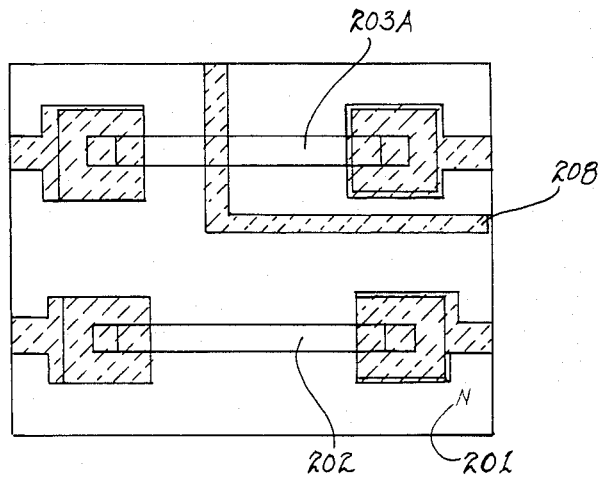
FIG. 4a and FIG. 4b.
Figure 4B:
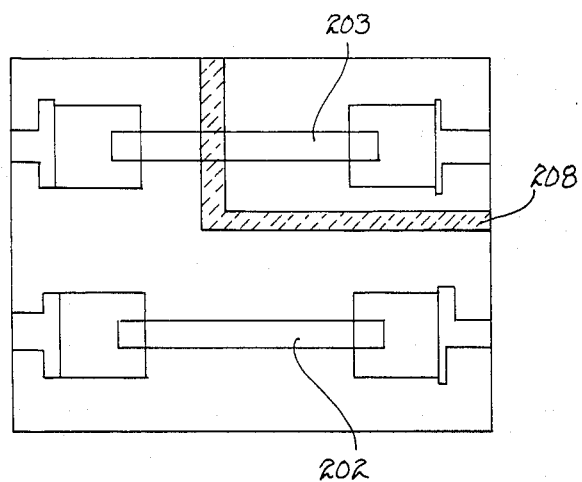

Referring to FIG. 4a, region 201 is again the epitaxial pocket, and region 202 and 203A are regions of P-diffusion operated at a high voltage by the circuit. Region 208 is a metal region operated at a low voltage and crossing over a high voltage diffusion region (separated by an insulation layer). Referring to FIG. 4b, the program has emphasized or highlighted the metal crossing region to indicate the location of the parasitic transistor (MOS parasitic device).

Figure 5A:
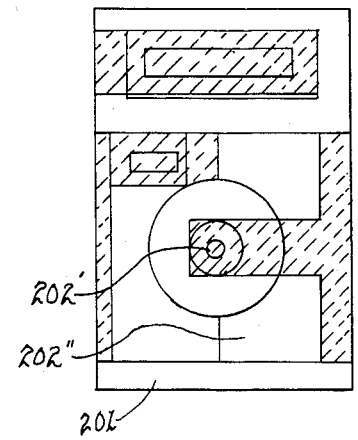
FIG. 5a and FIG. 5b are examples of the identification of parasitic transistors utilizing the present invention.
Figure 5B:
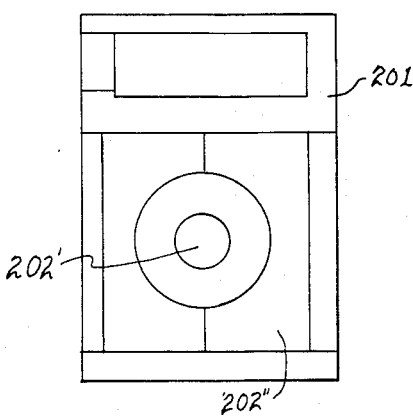

Referring to FIG. 5a, the epitaxial pocket 201 is shown. Regions 202' and 202" are P-diffusion regions operated at high voltage by the circuit. Because there is no protection for one side of the P-diffusion region 202", a parasitic transistor configuration is identified and the epitaxial pocket and associated elements is displayed by the procedure shown in FIG. 5b.

Operation of the Preferred Embodiment

The parasitic metal-oxide-semiconductor (MOS) transistor is created each time that a high voltage P-diffused region is present beneath or in the vicinity of low voltage metal region that is spaced from the high voltage P-diffused region by a thin insulating layer. Also, undesirable parasitic transistor action within the epitaxial pocket is created between certain regions within the epitaxial pocket when there are no intervening regions to prevent the undesired parasitic transistor interference. A high voltage region can be defined as a region with a potential voltage greater than one half the supply voltage, Vcc/2. For example, a high voltage P-diffusion region must be protected from the isolation region of the epitaxial pocket because the isolation region will be a P-diffusion region coupled to ground potential.

In order to prevent the creation of undesired parasitic MOS transistors, the high-voltage P-diffused regions in the epitaxial pocket can be protected, for example, by a surrounding N-diffused region, with a high voltage metal region, or with a high voltage metal region overlapping the high voltage P-diffused region. The most effective technique for protection against creation of parasitic MOS transistors is to surround completely the P-diffusion regions that will be at a high potential voltage during the operation of the circuit. However, prior to fabricating the protection regions, the potential parasitic transistor regions must first be identified.

The identification process first consists of the entry of the nodes, circuit parameters and operating conditions into an appropriate data processing system. The data processing system is then used to perform a circuit analysis of the circuit using a computer-aided circuit analysis program, either a commercially available program such as the SPICE program or a proprietary program with similar capabilities. The data resulting from the circuit analysis is maintained in files of the program. From these program files, a high voltage node (i.e., those nodes having a voltage greater than Vcc/2) is identified and placed in a separate file. Similarly, a computer-aided physical layout software program such as MASKAP, can be used to create a file locating each and every node of the circuit. These node would correspond to the nodes used by the circuit analysis program. The files from both software programs are combined and merged. A comparison is made between the high voltage node file and the circuit implementation layout.

The comparison operation creates an input file for the physical layout program to produces a graphical output of the inplementation of the integrated circuit for the semiconductor region. The graphic output shows, by highlighting, the high voltage P-diffused regions that are not completely protected. The program highlights the epitaxial pockets containing candidates for undesired parasitic transistor action such as the high voltage P-diffused regions, the low voltage P-diffused region inside the epitaxial pockets that are combined with unprotected high voltage P-diffused regions, the low voltage metal regions that overlie high voltage P-diffused regions located inside these epitaxial regions and all other possible areas that can be subject to parasitic transistor action so that corrective steps can be taken with those options that are available for protection of these regions.

The above description included to illustrate the operation of the preferred embodiment and is not meant to limit the scope of the invention. The scope of the invention is to be limited only by the following claims. From the above description, many variations will be apparent to one skilled in the art that would yet be encompassed by the spirit and scope of the invention.

What is claimed is:

1. A high voltage nodal method for identifying undesirable parasitic transistors in an integrated circuit design layout during the computer-aided design of an integrated circuit, said computer-aided design including a computer system with peripheral devices for accepting and storing a circuit's design data and executing commercially available computer-aided circuit analysis and circuit physical layout software programs according to said circuit design data, said peripheral devices including a terminal graphical display device, said method comprising the steps of:
   (a) executing a circuit analysis run on said stored circuit design data using said provided computer-aided circuit analysis software program;
   (b) creating a high voltage output data file according to said executed circuit analysis run, wherein the only information contained is circuit nodal information concerning whether a node voltage value is greater than a set high voltage value;
   (c) laying out a physical circuit design structure according to said stored circuit design data using said provided computer-aided circuit physical layout software program;
   (d) creating a physical design output data file according to said layed out physical circuit design structure wherein all circuit node locations are identified;
   (e) merging said created high voltage and physical design output data files;
   (f) creating a physical design input data file from said merging step, wherein, portions of said layed out physical circuit design structure, having nodes corresponding to a high voltage node, are idnetified;
   (g) inputting said physical design input data file to said computer system with said provided computer-aided circuit physical layout software program;
   (h) displaying on said graphical display device all circuit design structure corresponding to said physical design input data file, said display showing all suspect parasitic transistor regions in said circuit design structure; and
   (i) identifying, from said displaying step of said suspect parasitic transistor regions in said circuit design structure, all undesirable parasitic transistors.

2. A high voltage nodal method for identifying undesirable parasitic transistors in an integrated circuit design layout during the computer-aided design of an integrated circuit, as recited in claim 1 wherein:
   said step of creating a high voltage output data file includes providing input operating conditions and identification of the circuit nodes.

3. A high voltage nodal method for identifying undesirable parasitic transistors in an integrated circuit design layout during the computer-aided design of an integrated circuit, as recited in claim 1 wherein:
   said step of displaying on said graphical display device all circuit design structure corresponding to said physical design input data file includes displaying pre-selected structures in a semiconductor epitaxial region capable of interacting with the structure to create said undesired parasitic transistors.

4. A high voltage nodal method for identifying undesirable parasitic transistors in an integrated circuit design layout during the computer-aided design of an integrated circuit, as recited in claim 3 wherein:
   said step of displaying pre-selected structures in a semiconductor epitaxial region includes identifying and displaying epitaxial regions in which a high voltage P-diffused region is not protected from low voltage regions such as low voltage P-diffused regions and low voltage overlying metallic region.

5. A high voltage nodal method for identifying undesirable parasitic transistors in an integrated circuit design layout during the computer-aided design of an integrated circuit, as recited in claim 4 wherein:
   said step of displaying includes highlighting epitaxial regions having an undesirable parasitic transistor configuration.

6. A high voltage nodal method for identifying undesirable parasitic transistors in an integrated circuit design layout during the computer-aided design of an integrated circuit, said computer-aided design including a computer system with peripheral devices for accepting and storing a circuit's design data and executing commercially available computer-aided circuit analysis and circuit physical layout software programs according to said circuit design data, said peripheral devices including a terminal graphical display device, said method comprising the steps of:
   (a) providing design data for a circuit being designed in an integrated circuit design manner, said step of providing design data includes providing input operating conditions, a reference high voltage value for comparison purposes and identification of the circuit nodes;
   (b) inputting said circuit design data into said computer system for storage into a designated design data file;
   (c) executing a circuit analysis run on said stored circuit design data using said provided computer-aided circuit analysis software program;
   (d) creating a high voltage output data file according to said executed circuit analysis run, wherein the only information contained is circuit nodal information concerning whether a node voltage value is greater than said reference high voltage value;
   (e) laying out a physical circuit design structure according to said stored circuit design data using said provided computer-aided circuit physical layout software program;

(f) creating a physical design output data file according to said layed out physical circuit design structure wherein all circuit node locations are identified;

(g) merging said created high voltage and physical design output data files;

(h) creating a physical design input data file from said merging step, wherein, portions of said layed out physical circuit design structure, having nodes corresponding to a high voltage node, are identified;

(i) inputting said physical design input data file to said computer system with said provided computer-aided circuit physical layout software program;

(j) displaying on said graphical display device all circuit design structure corresponding to said physical design input data file, said display showing all suspect parasitic transistor regions in said circuit design structure, said displaying on said graphical display device all circuit design structure corresponding to said physical design input data file includes displaying pre-selected structures in a semiconductor epitaxial region capable of interacting with the structure to create said undesired parasitic transistors, said displaying pre-selected structures in a semiconductor epitaxial region includes identifying and displaying epitaxial regions in which a high voltage P-diffused region is not protected from low voltage regions such as low voltage P-diffused regions and low voltage overlying metallic region; and (k) identifying from said displaying step of said suspect parasitic transistor regions in said circuit design structure all undesirable parasitic transistors, said step of identifying includes highlighting, on said graphical display, epitaxial regions having an undesirable parasitic transistor configuration.

* * * * *